United States Patent
Choi et al.

(10) Patent No.: US 8,217,487 B2
(45) Date of Patent: Jul. 10, 2012

(54) POWER SEMICONDUCTOR DEVICE

(75) Inventors: Yongcheol Choi, Paju-si (KR);
Chang-Ki Jeon, Gimpo-si (KR);
Minsuk Kim, Bucheon-si (KR);
Donghwan Kim, Bucheon-si (KR)

(73) Assignee: Fairchild Korea Semiconductor Ltd. (KR)

( * ) Notice: Subject to any disclaimer, the term of this patent is extended or adjusted under 35 U.S.C. 154(b) by 81 days.

(21) Appl. No.: 12/763,689

(22) Filed: Apr. 20, 2010

(65) Prior Publication Data

US 2010/0271079 A1     Oct. 28, 2010

(30) Foreign Application Priority Data

Apr. 23, 2009   (KR) .................. 10-2009-0035525

(51) Int. Cl.
*H02M 3/07* (2006.01)
*H01L 21/70* (2006.01)
(52) U.S. Cl. ......... 257/500; 257/E27.016; 257/E21.008; 327/589
(58) Field of Classification Search .................. 257/500, 257/516, 528, 532, E27.016, E27.034, E21.008; 327/108, 390, 589
See application file for complete search history.

(56) References Cited

U.S. PATENT DOCUMENTS

| 6,507,085 | B2 |   | 1/2003 | Shimizu |
| 6,825,700 | B2 |   | 11/2004 | Hano |
| 7,106,105 | B2 | * | 9/2006 | Bryson ........................ 326/88 |

* cited by examiner

*Primary Examiner* — Thomas L Dickey
*Assistant Examiner* — Nikolay Yushin
(74) *Attorney, Agent, or Firm* — Cantor Colburn LLP

(57) ABSTRACT

Disclosed is a power semiconductor device including a bootstrap circuit. The power semiconductor device includes a high voltage unit that provides a high voltage control signal so that a high voltage is output; a low voltage unit that provides a low voltage control signal so that a ground voltage is output, and is spaced apart from the high voltage unit; a charge enable unit that is electrically connected to the low voltage unit and charges a bootstrap capacitor for supplying power to the high voltage unit when the high voltage is output, when the ground voltage is output; and a high voltage cut-off unit that cuts off the high voltage when the high voltage is output so that the high voltage is not applied to the charge enable unit, and includes a first terminal electrically connected to the charge enable unit and a second terminal electrically connected to the high voltage unit.

23 Claims, 10 Drawing Sheets

POWER SEMICONDUCTOR DEVICE

CROSS-REFERENCE TO RELATED PATENT APPLICATION

This application claims the benefit of Korean Patent Application No. 10-2009-0035525, filed on Apr. 23, 2009, in the Korean Intellectual Property Office, the disclosure of which is incorporated herein in its entirety by reference.

BACKGROUND OF THE INVENTION

1. Field of the Invention

The present invention relates to a power semiconductor device for driving a power device, and more particularly, to a power semiconductor device such as a high voltage integrated circuit (HVIC) that includes a bootstrap circuit including a charge enable unit and a high voltage cut-off unit.

2. Description of the Related Art

A high voltage integrated circuit (HVIC), in which one or more high voltage transistors are arranged on a single chip together with low voltage circuits, are commonly used in a power control system such as a switching power supply or a motor driver. In general, an HVIC includes a high voltage unit and a low voltage unit. The low voltage unit operates in a fixed reference voltage environment such as a ground voltage. However, the high voltage unit should operate in a reference voltage environment that varies to a high voltage or a ground voltage according to a pulse width modulation (PWM) signal.

In order to stably operate the high voltage unit in a variable reference voltage environment, a bootstrap circuit is used in addition to a HVIC. The bootstrap circuit includes a capacitor connected in parallel to the high voltage unit at a driving power source terminal of the high voltage unit. The bootstrap circuit also includes a diode. The diode may open the bootstrap circuit when a PWM signal is at logic high and may supply a current to a capacitor by providing a current path when the PWM signal is at logic low.

A user should connect a bootstrap circuit to an HVIC in order to operate the HVIC. Also, due to the bootstrap circuit, the size of a whole module increases.

SUMMARY OF THE INVENTION

In order to solve the above problems, the present invention suggests a power semiconductor device including a bootstrap driving circuit for supplying a current to a capacitor as a bootstrap circuit.

If a power semiconductor device includes a bootstrap driving circuit, the bootstrap driving circuit may be broken due to a high voltage applied to a high voltage unit. Also, elements included in the bootstrap driving circuit may form a parasite transistor and thus a current may flow to a semiconductor substrate as the parasite transistor is turned on.

The present invention provides a power semiconductor device including a bootstrap driving circuit that is not broken due to a high voltage and is capable of blocking a current flowing to a substrate as a parasite transistor is turned on.

According to an aspect of the present invention, there is provided a power semiconductor device including a high voltage unit that provides a high voltage control signal so that a high voltage is output; a low voltage unit that provides a low voltage control signal so that a ground voltage is output, and is spaced apart from the high voltage unit; a charge enable unit that is electrically connected to the low voltage unit and charges a bootstrap capacitor for supplying power to the high voltage unit when the high voltage is output, when the ground voltage is output; and a high voltage cut-off unit that cuts off the high voltage when the high voltage is output so that the high voltage is not applied to the charge enable unit, and comprises a first terminal electrically connected to the charge enable unit and a second terminal electrically connected to the high voltage unit.

The charge enable unit may include a diode. The diode may include an anode and a cathode, the anode may be electrically connected to a driving power source, and the cathode may be electrically connected to the first terminal of the high voltage cut-off unit by a conductive layer. The charge enable unit may include an n-type semiconductor layer formed on a p-type semiconductor substrate; an insulating layer formed on the n-type semiconductor layer; and a p-type conductive layer and an n-type conductive layer formed on the insulating layer in a junction. A first isolation region may be formed in the n-type semiconductor layer, and the charge enable unit and the low voltage unit may be isolated from each other by the first isolation region. The p-type conductive layer may be insulated from the n-type semiconductor layer by the insulating layer. A cathode contact may be formed on the n-type conductive layer, a source region having a high concentration, on which the first terminal of the high voltage cut-off unit is formed, may be formed on the n-type semiconductor layer, and the cathode contact may be electrically connected to the source region. The p-type conductive layer and the n-type conductive layer may be formed of polysilicon.

The charge enable unit may include a PNP transistor. The PNP transistor may include an emitter, a base, and a collector, the emitter may be electrically connected to a driving power source, and the base and the collector may be electrically connected to the first terminal of the high voltage cut-off unit. The charge enable unit may include an n-type semiconductor layer formed on a p-type semiconductor substrate; a p-type well formed in the n-type semiconductor layer; an n-type well formed in the p-type well; and a p-type body formed in the n-type well. The p-type well may include a p-type under layer formed under the n-type well and a p-type side well formed at a side of the n-type well, and the p-type under layer may have a higher concentration than that of the p-type side well. The charge enable unit may further include an n-type under layer formed between the p-type semiconductor substrate and the p-type well. The n-type under layer may have a higher concentration than that of the p-type well and the n-type well. The power semiconductor device may further include an emitter region having a high concentration that is formed in the p-type body; a base region having a high concentration that is formed in the n-type well; a collector region having a high concentration that is formed in the p-type well; a base contact formed on the base region; and a collector contact formed on the collector region, a source region having a high concentration, on which the first terminal of the high voltage cut-off unit is formed, may be formed on the n-type semiconductor layer, and the base contact and the collector contact may be electrically connected to the source region.

The high voltage cut-off unit may include an n-channel junction field effect transistor (JFET), and the first and second terminals of the high voltage cut-off unit may be a source and a drain of the n-channel JFET, respectively. The high voltage cut-off unit may include an n-type semiconductor layer formed on a p-type semiconductor substrate; and a p-type field forming layer formed in the n-type semiconductor layer. The power semiconductor device may further include a source region having a high concentration that is formed in the n-type semiconductor layer; a source contact formed on the source region; a drain region having a high concentration that is formed in the n-type semiconductor layer; a drain contact formed on the drain region; a gate region having a high concentration that is formed in the p-type field forming layer; and a gate contact formed on the gate region, and the gate region may be closer to the source region than to the drain region. The high voltage cut-off unit may further include a p-type well that partially overlaps the p-type field forming layer under the gate region and has a greater thickness than that of the p-type field forming layer. The high voltage cut-off unit may further include an n-type buried layer formed between the n-type semiconductor layer and the p-type semiconductor substrate and below the drain region, and the n-type buried layer may have a higher concentration than that of the p-type field forming layer. A gate contact of the n-channel JFET may be grounded. The high voltage cut-off unit and the high voltage unit may be isolated from each other by a second isolation region formed in the n-type semiconductor layer.

The high voltage unit, the low voltage unit, the charge enable unit, and the high voltage cut-off unit may be formed on a p-type semiconductor substrate, the charge enable unit and the high voltage cut-off unit may be formed on an n-type semiconductor layer formed on the p-type semiconductor substrate, and the charge enable unit and the high voltage cut-off unit may be directly connected to each other without a separate isolation region, on the n-type semiconductor layer.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
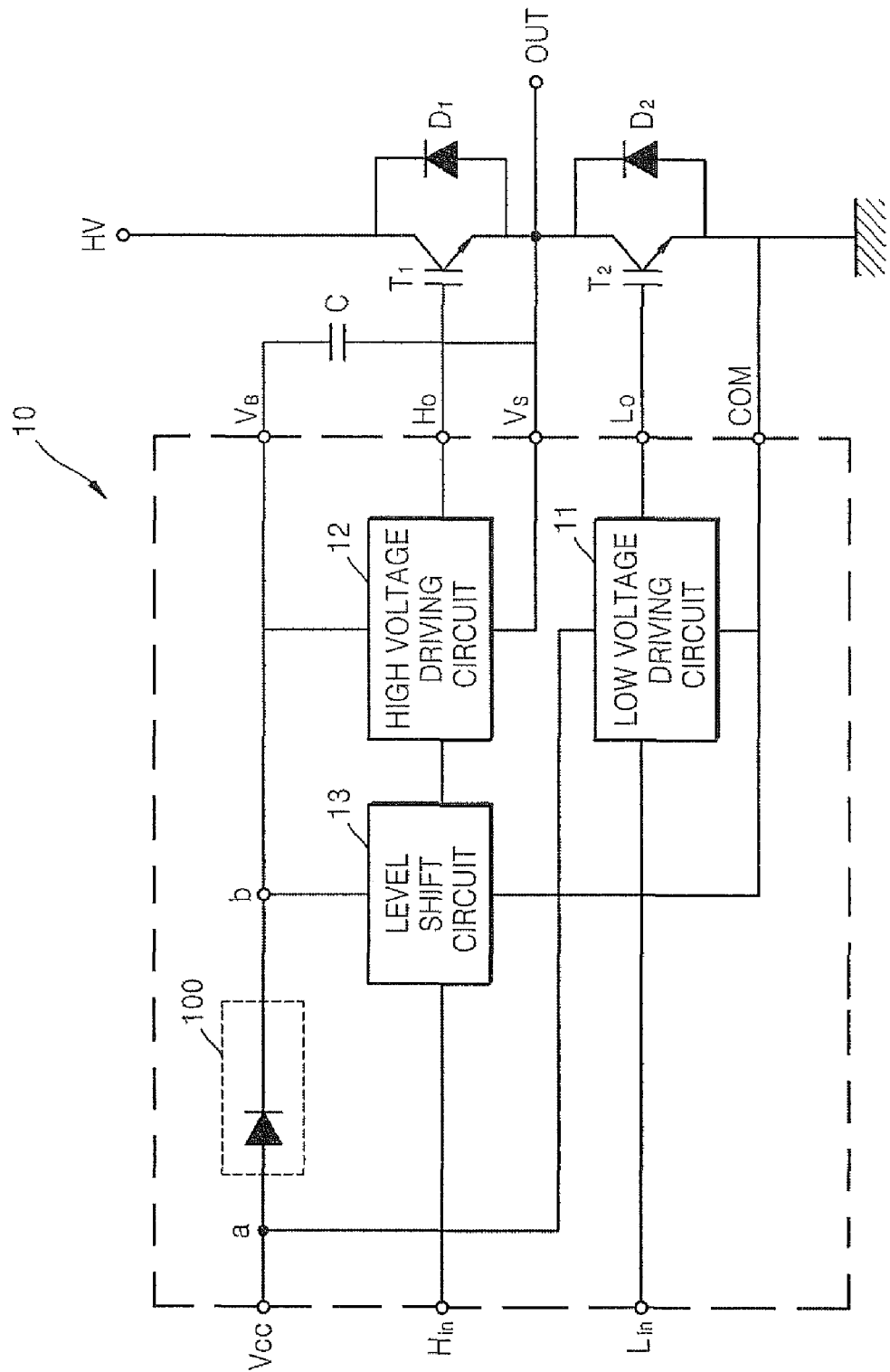
FIG. 1 is an equivalent circuit diagram of a power semiconductor device to which various embodiments of the present invention are applied.

Hereinafter, the present invention will be described in detail by explaining embodiments of the invention with reference to the attached drawings.

The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art.

It will also be understood that when a layer is referred to as being "on" another layer or substrate, it can be directly on the other layer or substrate, or intervening layers may also be present. In the drawings, the thicknesses of layers and regions are exaggerated for clarity. Like reference numerals in the drawings denote like elements. As used herein, the term "and/or" refers to one of or a combination of at least two of listed items.

The terminology used herein is for the purpose of describing particular embodiments and is not intended to limiting the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

As disclosed in the present invention, a substrate may be an arbitrary polygonal substrate, an edge region indicates a region outside a region in which a semiconductor chip is disposed on the substrate and which includes edges of the substrate, and a corner region is a region in which neighboring edges cross each other and which includes a vertex of the substrate.

Embodiments of the invention are described herein with reference to schematic illustrations of idealized embodiments (and intermediate structures) of the invention. As such, variations from the shapes of the illustrations as a result, for example, of manufacturing techniques and/or tolerances, are to be expected. Thus, the embodiments of the invention should not be construed as limited to the particular shapes of regions illustrated herein, but are to include deviations in shapes that result, for example, from manufacturing.

FIG. 1 is an equivalent circuit diagram of a power semiconductor device 10 such as a high voltage integrated circuit (HVIC), to which various embodiments of the present invention may be applied.

Referring to FIG. 1, the power semiconductor device 10 includes a low voltage driving circuit 11, a high voltage driving circuit 12, a level shift circuit 13, and a bootstrap driving circuit 100. A bootstrap capacitor C is connected in parallel to voltage terminals $V_B$ and $V_S$ for providing power to the high voltage driving circuit 12. A high voltage output terminal $H_O$ of the high voltage driving circuit 12 is connected to a gate of a first power transistor $T_1$ and the first power transistor $T_1$ is connected in parallel to a first diode $D_1$. A low voltage output terminal $L_O$ of the low voltage driving circuit 11 is connected to a gate of a second power transistor $T_2$ and the second power transistor $T_2$ is connected in parallel to a second diode $D_2$. A source of the first power transistor $T_1$ is connected to a high voltage HV, the first and second power transistors $T_1$ and $T_2$ are connected in series to each other, and a drain of the second power transistor $T_2$ is grounded.

The low voltage driving circuit 11 controls the second power transistor $T_2$ by outputting a low voltage control signal to the low voltage output terminal $L_O$ based on a signal input through a low voltage input terminal $L_{in}$. The low voltage driving circuit 11 may operate by receiving power supplied from a driving power source terminal $V_{CC}$ and a common terminal COM, for example, a potential difference between a ground voltage and a driving voltage. Although not illustrated in FIG. 1, the low voltage driving circuit 11 may include an input signal processing circuit (not shown) for processing an input signal, a lockout circuit (not shown) for protecting internal circuits from an input signal, a delay circuit (not shown) for preventing collision with a high voltage input signal, a gate driving circuit (not shown) for providing a low voltage control signal to the second power transistor $T_2$, and a under-voltage lockout (UVLO) (not shown) for protecting a driving power source.

The high voltage driving circuit 12 controls the first power transistor $T_1$ by outputting a high voltage control signal to the high voltage output terminal $H_O$ in response to a signal provided from the level shift circuit 13. The high voltage driving circuit 12 may operate by using power supplied from the bootstrap capacitor C, which is connected between the voltage terminal $V_B$ and the voltage terminal $V_S$ that has the same electric potential as an output terminal OUT. Although not illustrated in FIG. 1, the high voltage driving circuit 12 may include a logic filter circuit (not shown) for removing noise from a signal provided from the level shift circuit 13, a reset-set (RS) latch circuit (not shown) for processing a signal, a UVLO (not shown), and a gate driving circuit (not shown) for providing a high voltage control signal to the first power transistor $T_1$.

The level shift circuit 13 provides a signal input from a high voltage input terminal $H_{in}$ to the high voltage driving circuit 12. A reference voltage of the high voltage driving circuit 12 may be the high voltage HV or a low voltage, e.g., the ground voltage, based on the state of a pulse width modulation (PWM) signal output from the output terminal OUT. As such, when the reference voltage of the high voltage driving circuit 12 may be changed, the level shift circuit 13 provides a logic value (0 or 1) input from the high voltage input terminal $H_{in}$ to the high voltage driving circuit 12. Although not illustrated in FIG. 1, the level shift circuit 13 may include a set level shift device for allowing the high voltage driving circuit 12 to output an on signal and a reset level shift device for allowing the high voltage driving circuit 12 to output an off signal. Each of the set and reset level shift devices may include a laterally diffused metal oxide semiconductor (LDMOS).

Operation of the power semiconductor device 10 will now be described before describing the bootstrap driving circuit 100.

The power semiconductor device 10 is a circuit for outputting the high voltage HV or the low voltage, e.g., the ground voltage, to the output terminal OUT in response to signals input from the high voltage input terminal $H_{in}$ and the low voltage input terminal $L_{in}$. When the low voltage driving circuit 11 turns on the second power transistor $T_2$ through the low voltage output terminal $L_O$, the output terminal OUT outputs the low voltage, i.e., the ground voltage. The second diode $D_2$ prevents a reverse voltage. In this case, in order to prevent the high and low voltages from being applied together to the output terminal OUT, the high voltage driving circuit 12 should turn off the first power transistor $T_1$. In this case, in order to operate the high voltage driving circuit 12 as described above, power is provided to the high voltage driving circuit 12 due to a potential difference between the ground voltage output from the output terminal OUT and the driving voltage output from the driving power source terminal $V_{CC}$. Also, the driving power source charges the bootstrap capacitor C to about the same level as the driving voltage $V_{CC}$ by providing a current to the bootstrap capacitor C through the bootstrap driving circuit 100 and thus the bootstrap capacitor C is charged to a charge voltage $V_C$. Although one skilled in the art may know about a voltage drop that occurs in the bootstrap driving circuit 100, for better understanding of the present invention, the voltage drop, which is much smaller than the driving voltage $V_{CC}$, is ignored herein.

Then, when the low voltage driving circuit 11 outputs an off signal so as to turn off the second power transistor $T_2$, and the high voltage driving circuit 12 provides an on signal to the first power transistor $T_1$ through the high voltage output terminal $H_O$ so as to turn on the first power transistor $T_1$, the output terminal OUT outputs the high voltage HV. The first diode $D_1$ prevents a reverse voltage. In this case, the high voltage HV will be applied to the voltage terminal $V_S$. Also, since the voltage terminal $V_B$ is connected to the bootstrap capacitor C, which is connected to the voltage terminal $V_S$, the voltage terminal $V_B$ will have an electric potential obtained by adding the high voltage HV to the charge voltage $V_C$ of the bootstrap capacitor C, i.e., HV+$V_C$. Since the charge voltage $V_C$ is almost the same as the driving voltage $V_{CC}$, the electric potential of the voltage terminal will be HV+$V_{CC}$ substantially. Thus, the high voltage driving circuit 12 and the level shift circuit 13 may operate by using a potential difference between the voltage terminals $V_B$ and $V_S$, i.e., the driving voltage $V_{CC}$ charged in the bootstrap capacitor C.

In this case, since a voltage (HV+$V_C$) obtained by adding the charge voltage $V_C$ to the high voltage HV is applied to the voltage terminal $V_B$ and the driving voltage $V_{CC}$ is applied to a driving power source terminal $V_{CC}$, a reverse voltage is applied to the bootstrap driving circuit 100, e.g., a diode, and thus the bootstrap driving circuit 100 is open. That is, nodes a and b are open. However, since a potential difference between the nodes a and b is very high to reach the high voltage HV, the bootstrap driving circuit 100 may be broken and the power semiconductor device 10 may be broken due to a current flowing from the node b to the node a.

As such, in a normal operation state of the power semiconductor device 10, when the second power transistor $T_2$ is turned on, the bootstrap driving circuit 100 provides a path for providing a current to the bootstrap capacitor C. On the other hand, when the first power transistor $T_1$ is turned on, the bootstrap driving circuit 100 is open.

Figure 2:
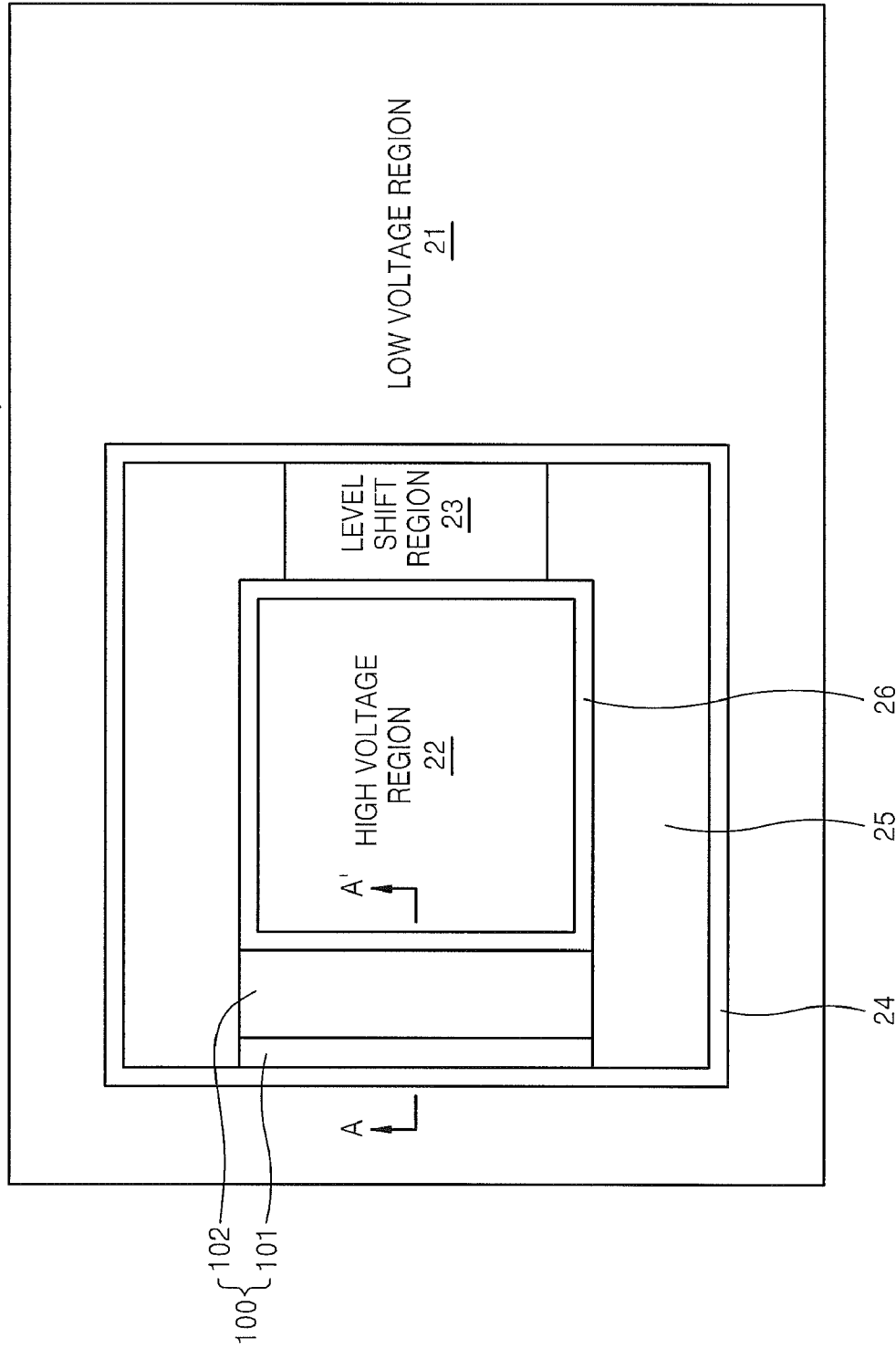
FIG. 2 is a schematic plan view of a power semiconductor device according to an embodiment of the present invention.

FIG. 2 is a schematic plan view of a power semiconductor device 10 according to an embodiment of the present invention.

Referring to FIG. 2, the power semiconductor device 10 is formed on a semiconductor substrate and includes a high voltage region 22 and a low voltage region 21 that surrounds the high voltage region 22. A first isolation region 24, an epitaxial region 25, and a second isolation region 26 may be formed between the high voltage region 22 and the low voltage region 21. Also, a level shift region 23 may be formed between the high voltage region 22 and the low voltage region 21. The level shift circuit 13 for providing a control signal provided from the high voltage input terminal $H_{in}$ shown in FIG. 1, which is formed in the low voltage region 21, to the high voltage region 22 is formed in the level shift region 23. Furthermore, the bootstrap driving circuit 100 may also be formed between the high voltage region 22 and the low voltage region 21. The bootstrap driving circuit 100 may include a charge enable unit 101 and a high voltage cut-off unit 102.

The high voltage driving circuit 12 of FIG. 1 may be formed in the high voltage region 22. The low voltage driving circuit 11 of FIG. 1 may be formed in the low voltage region 21. The charge enable unit 101 may be formed adjacent to the low voltage region 21 and the high voltage cut-off unit 102 may be formed between the charge enable unit 101 and the high voltage region 22. In the present invention, the low voltage driving circuit 11 and the high voltage driving circuit 12 shown in FIG. 1 are terms for representing functions of circuits, and the low voltage region 21 and the high voltage region 22 shown in FIG. 2 are terms for representing spaces and/or structures embodying the low voltage driving circuit 11 and the high voltage driving circuit 12, respectively. The low voltage driving circuit 11 and the low voltage region 21, and the high voltage driving circuit 12 and the high voltage region 22 may be collectively referred to as a low voltage unit and a high voltage unit, respectively.

Although the bootstrap driving circuit 100 is disposed opposite to the level shift region 23 in FIG. 2, the present invention is not limited thereto. Also, a width and a length of the bootstrap driving circuit 100 may be designed differently based on the level of a high voltage. For example, although the bootstrap driving circuit 100 is connected to one side of the high voltage region 22 in FIG. 2, the bootstrap driving circuit 100 may be formed to include two sides or three sides and corners of the high voltage region 22 in order to resist a higher voltage. Also, a gap between the high voltage region 22 and the low voltage region 21, in which the bootstrap driving circuit 100 is disposed, may increase.

Figure 3:
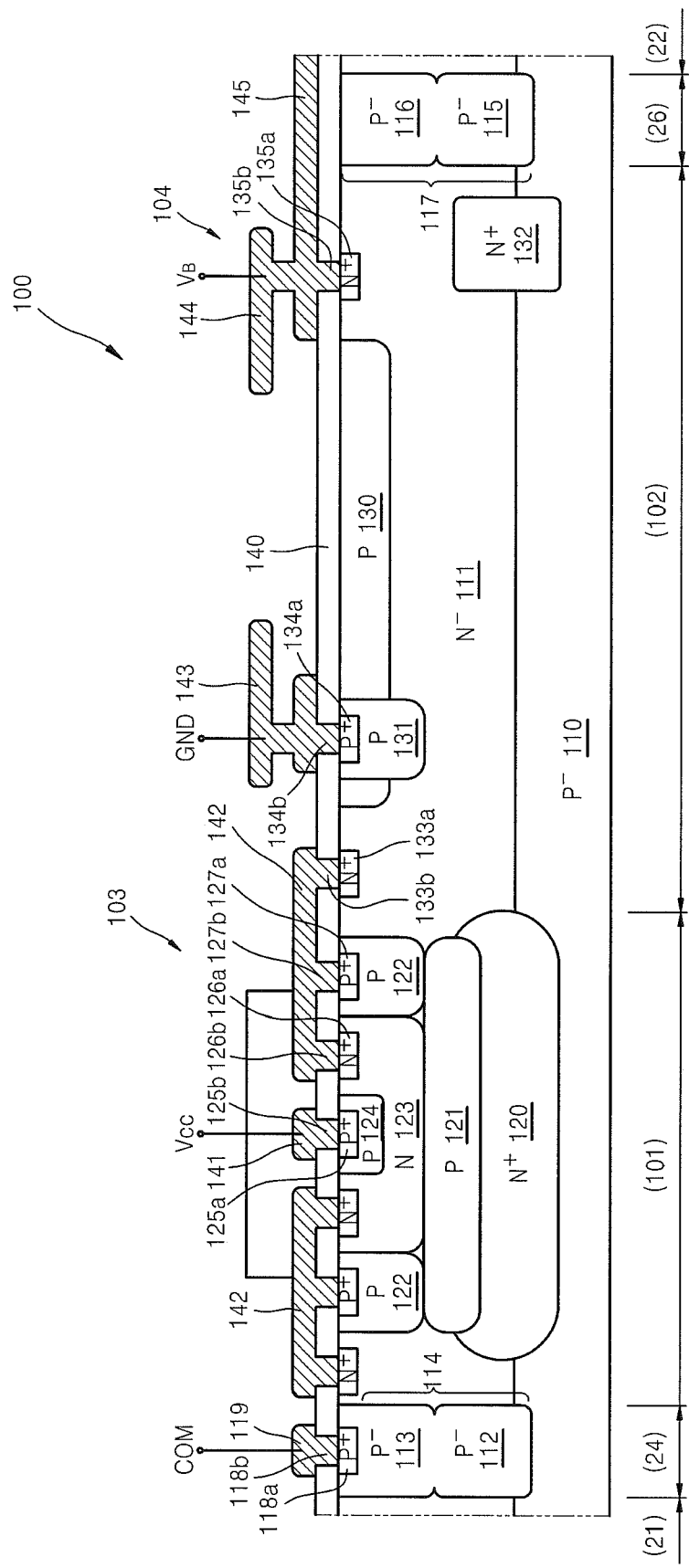
FIG. 3 is a cross-sectional view of a bootstrap driving circuit illustrated in FIG. 2 taken along a line A-A', according to an embodiment of the present invention.

FIG. 3 is a cross-sectional view of the bootstrap driving circuit 100 taken along a line A-A' illustrated in FIG. 2, according to an embodiment of the present invention.

Referring to FIG. 3, an n-type semiconductor layer 111 may be formed on a p-type semiconductor substrate 110 having a low concentration.

The n-type semiconductor layer 111 may be an n-type epitaxial layer having a low concentration that is formed by performing an epitaxial process. The n-type semiconductor layer 111 may be divided into a low voltage region 21, a first isolation region 24, a charge enable unit 101, a high voltage cut-off unit 102, a second isolation region 26, and a high voltage region 22.

A first isolation layer 114 for isolating the low voltage region 21 and the charge enable unit 101 from each other may be formed in the first isolation region 24. For example, the first isolation layer 114 may include a p-type under layer 112 having a low concentration formed through an interface between the p-type semiconductor substrate 110 and the n-type semiconductor layer 111, and a p-type well 113 having a low concentration formed on the p-type under layer 112. A ground region 118a having a high concentration may be formed in the p-type well 113. A ground contact 118b may be formed on the ground region 118a and may be electrically connected to the common terminal COM illustrated in FIG. 1 through a conductive layer 119. As such, the first isolation layer 114 and the p-type semiconductor substrate 110 may be grounded. However, the present invention is not limited to the ground contact 118b and the ground region 118a formed in the p-type well 113 and the p-type semiconductor substrate 110 may be grounded by using another method or structure.

A second isolation layer 117 for isolating the high voltage cut-off unit 102 and the high voltage region 22 from each other may be formed on the second isolation region 26. For example, the second isolation layer 117 may include a p-type under layer 115 having a low concentration formed through an interface between the p-type semiconductor substrate 110 and the n-type semiconductor layer 111, and a p-type well 116 having a low concentration formed on the p-type under layer 115.

As illustrated in FIG. 3, it should be noticed that the charge enable unit 101 and the high voltage cut-off unit 102 are directly connected to each other without a separate isolation region for isolating them from each other. As such, the size of the bootstrap driving circuit 100 may be reduced.

The charge enable unit 101 according to the current embodiment will now be described.

Figure 4:
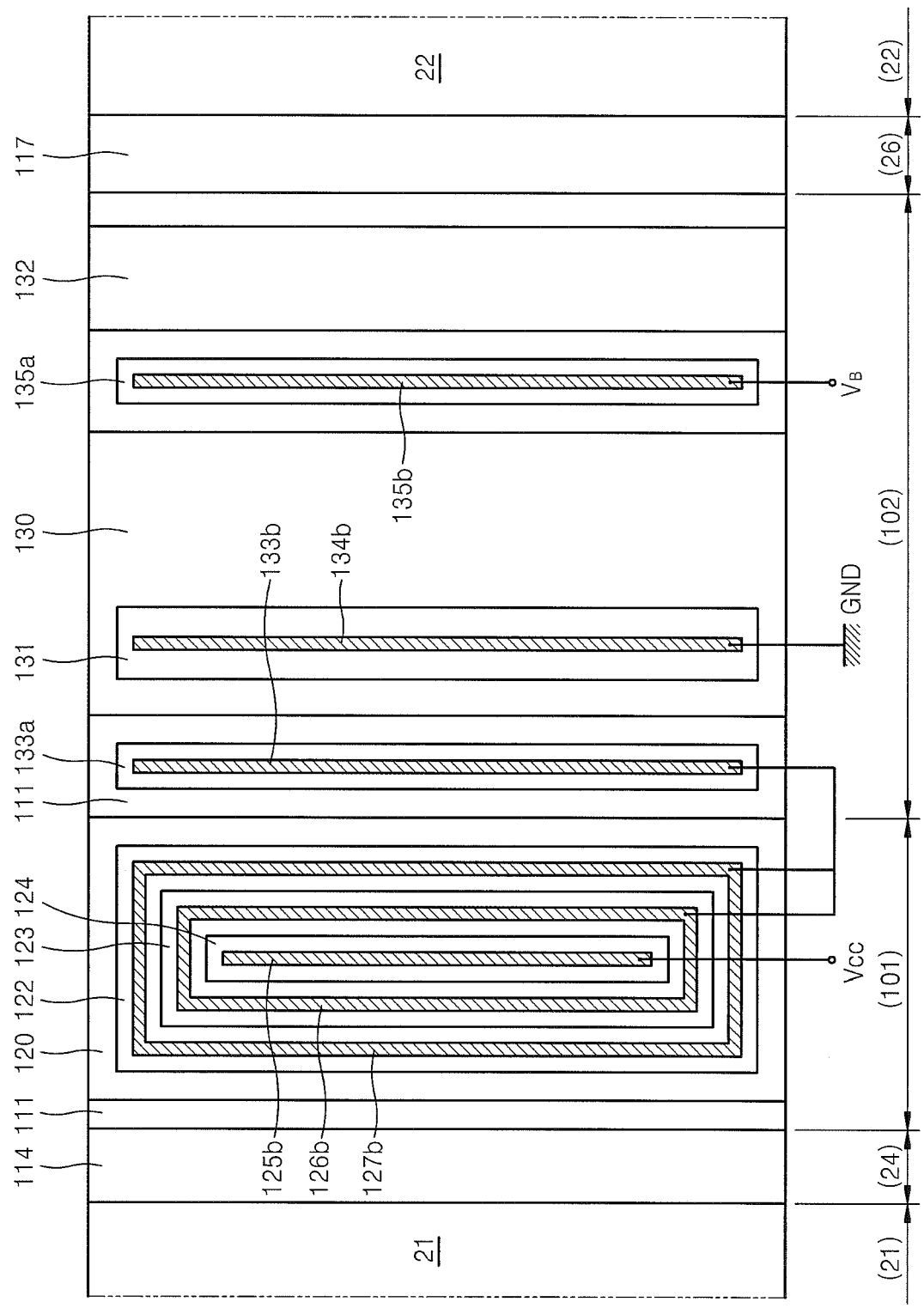
FIG. 4 is a magnified view of the bootstrap driving circuit illustrated in FIG. 2.

A p-type under layer 121 may be formed in the n-type semiconductor layer 111, or between the n-type semiconductor layer 111 and the p-type semiconductor substrate 110. A p-type well 122 may be formed on an edge region of the p-type under layer 121. The p-type under layer 121 may have a higher concentration than that of the p-type well 122. As illustrated in FIG. 4, the p-type well 122 and the p-type under layer 121 are formed over a whole surface of the charge enable unit 101. The p-type well 122 and the p-type under layer 121 may be collectively referred to as a p-type well. An n-type well 123 may be formed on the p-type under layer 121 and at an inner side of the p-type well 122 so as to be surrounded by the p-type well 122 and the p-type under layer 121. A p-type body 124 may be formed in the n-type well 123.

As illustrated in FIG. 3, the above structure forms a vertical PNP transistor 103. The p-type body 124 functions as an emitter of the PNP transistor 103, the n-type well 123 functions as a base of the PNP transistor 103, and the p-type well 122 and the p-type under layer 121 function as a collector of the PNP transistor 103. An emitter region 125a having a high concentration is connected to an emitter contact 125b and may be formed in the p-type body 124. A base region 126a having a high concentration is connected to a base contact 126b and may be formed in the n-type well 123. A collector region 127a having a high concentration is connected to a collector contact 127b and may be formed in the p-type well 122.

The emitter contact 125b may be electrically connected to the driving power source terminal $V_{CC}$ illustrated in FIG. 1 through a conductive layer 141. The base contact 126b and the collector contact 127b are commonly connected to a conductive layer 142. The conductive layer 142 is electrically connected to a source contact 133b that is connected to an n-type source region 133a having a high concentration and is formed in the n-type semiconductor layer 111. Although the conductive layer 142 is divided into two portions with reference to the conductive layer 141 in FIG. 3, as illustrated in FIG. 4, the conductive layer 142 may be formed at an outer side of the p-type body 124 to surround the p-type body 124 and thus the divided portions illustrated in FIG. 3 may be electrically connected to each other.

Although the base contact 126b and the collector contact 127b are formed at both sides of the n-type well 123 and the p-type well 122, respectively, in FIG. 3, the present invention is not limited thereto. According to another embodiment of the present invention, the base contact 126b and the collector contact 127b may be formed only on one side, for example, one side near the high voltage cut-off unit 102, i.e., a right side in FIG. 3.

An n-type under layer 120 may be formed between the p-type under layer 121 and the p-type semiconductor substrate 110. The n-type under layer 120 prevents a current from flowing from the p-type under layer 121, which functions as the collector of the PNP transistor 103, to the p-type semiconductor substrate 110. The n-type under layer 120 may have a higher concentration than that of the p-type under layer 121. As such, the n-type under layer 120 may prevent a current from flowing from the p-type under layer 121 by recombination of electrons and holes.

Figure 5:
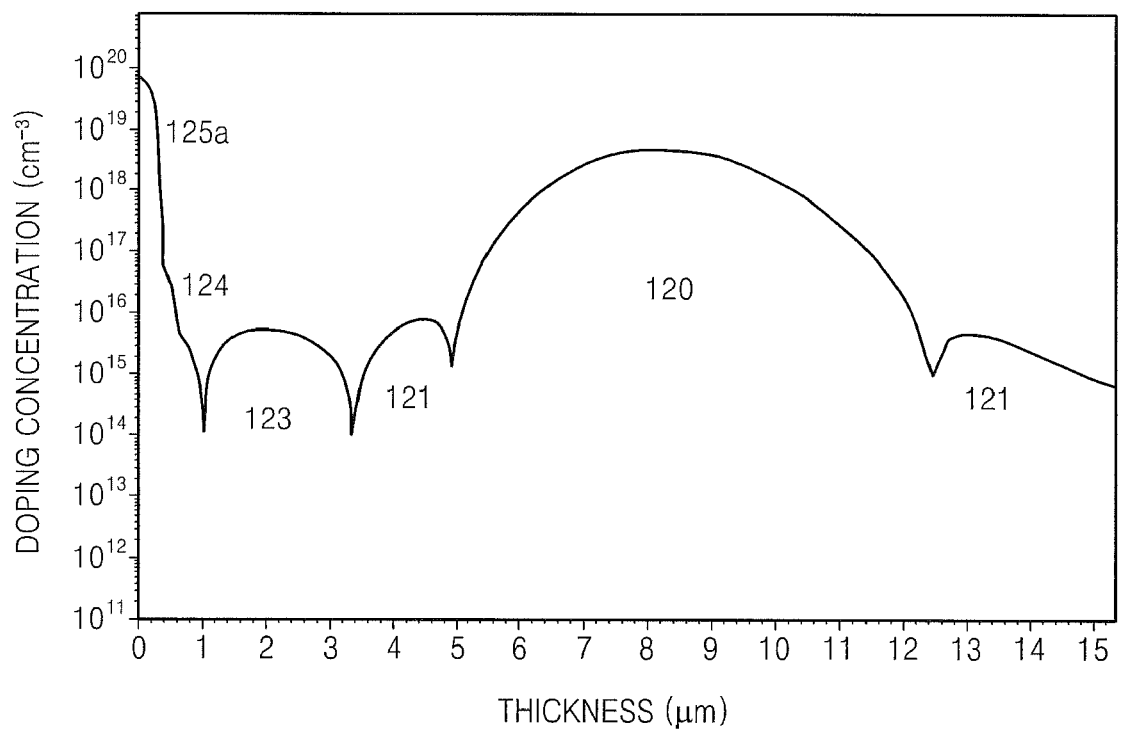
FIG. 5 is a graph showing exemplary concentration distribution between an emitter region and a p-type semiconductor substrate of the bootstrap driving circuit illustrated in FIG. 3.

FIG. 5 is a graph showing exemplary concentration distribution between the emitter region 125a and the p-type semiconductor substrate 110 of the bootstrap driving circuit 100 illustrated FIG. 3.

Referring to FIG. 5, the emitter region 125a should be electrically connected to the emitter contact 125b and thus has a very high concentration, for example, about $10^{20}/cm^3$. The p-type body 124, the n-type well 123, and the p-type under layer 121 have higher concentrations than that of the n-type semiconductor layer 111 or that of the p-type semiconductor substrate 110, for example, about $10^{15}/cm^3$-$10^{16}/cm^3$. The n-type under layer 120 has a higher concentration than that of the p-type under layer 121, for example, about $10^{18}/cm^3$-$10^{19}/cm^3$. In FIG. 5, the p-type under layer 121 is also formed under the n-type under layer 120. The p-type under layer 121 may be formed under the n-type under layer 120 as the p-type under layer 121 may be diffused downward according to a manufacturing process, and the present invention is not limited thereto.

According to the current embodiment, the driving voltage $V_{CC}$ is applied to the emitter region 125a of the PNP transistor 103. If an electric potential of the n-type source region 133a of the n-type semiconductor layer 111 is lower than the driving voltage $V_{CC}$, a current flows from the emitter region 125a of the PNP transistor 103 to the base region 126a through a PN junction between the p-type body 124 and the n-type well 123. In addition, the current from the emitter region 125a flows to the collector region 127a through a junction between the n-type well 123 and the p-type under layer 121.

However, on the other hand, if the electric potential of the n-type source region 133a of the n-type semiconductor layer 111 is higher than the driving voltage $V_{CC}$, that is, if a reference electric potential of the high voltage region 22 is the high voltage HV, a reverse voltage is applied to the PN junction between the p-type body 124 and the n-type well 123 and thus a current does not flow. However, if the electric potential of the n-type source region 133a is higher than a break voltage, a current may flow backward and thus the high voltage cut-off unit 102 to be described later is required.

The charge enable unit 101 may be manufactured as described below. Initially, the p-type semiconductor substrate 110 is formed. The p-type semiconductor substrate 110 may be formed by doping a p-type material onto the entire surface of a semiconductor substrate. Then, an n-type material for forming the n-type under layer 120 is doped onto the p-type semiconductor substrate 110. A p-type material for forming the p-type under layer 121 is doped onto the n-type material. Then, the n-type semiconductor layer 111 is formed on the p-type semiconductor substrate 110. The n-type semiconductor layer 111 may be epitaxially grown together with an n-type material. In this process, a p-type material and an n-type material may be diffused and formed as illustrated in FIG. 3. Then, for example, the p-type well 122 and the n-type well 123 may be formed by using an ion injection method. Then, the p-type body 124 may be formed. Then, an insulating layer 140 may be formed on the n-type semiconductor layer 111. Holes for forming the drain contact 125b, the base contact 126b, and the collector contact 127b may be formed by etching the insulating layer 140. The drain region 125a, the base region 126a, and the collector region 127a may be formed through the holes by using an ion injection method. Then, the drain contact 125b, the base contact 126b, and the collector contact 127b are formed on the drain region 125a, the base region 126a, and the collector region 127a, respectively, and then the conductive layers 141 and 142 may be formed.

The high voltage cut-off unit 102 according to the current embodiment will now be described.

The high voltage cut-off unit 102 is directly connected to the charge enable unit 101 without a separate isolation region. As illustrated in FIG. 3, the high voltage cut-off unit 102 forms an n-channel junction field effect transistor (JFET) 104. The n-type semiconductor layer 111 may be formed on the p-type semiconductor substrate 110. A p-type field forming layer 130 may be formed in the n-type semiconductor layer 111. The n-type source region 133a and an n-type drain region 135a may be separately formed at two sides of the p-type field forming layer 130. The n-type source region 133a and the n-type drain region 135a may have higher concentrations than that of the n-type semiconductor layer 111. The source contact 133b may be formed on the n-type source region 133a and a drain contact 135b may be formed on the n-type drain region 135a. As described above, the source contact 133b is electrically connected to the base contact 126b and the collector contact 127b of the charge enable unit 101 through the conductive layer 142.

In the above structure, the n-type source region 133a and the n-type drain region 135a are electrically connected to each other through the n-type semiconductor layer 111. Thus, a current may flow from the n-type source region 133a to the n-type drain region 135a. However, a resistance component that is variable according to the concentration of the n-type semiconductor layer 111 may be formed between the n-type source region 133a and the n-type drain region 135a.

For example, a p-type gate region 134a having a high concentration may be formed in the p-type field forming layer 130. The p-type gate region 134a may be formed close to the n-type source region 133a in order to protect the PNP transistor 103 of the charge enable unit 101. A gate contact 134b may be formed on the p-type gate region 134a. The gate contact 134b may be connected to the ground voltage, for example, the common terminal COM illustrated in FIG. 1. Although the common terminal COM and a ground terminal GND are separated from each other in the present invention, the common terminal COM and the ground terminal GND may be regarded as the same terminal. Although the common terminal COM outputs a reference voltage for representing the driving voltage $V_{CC}$ and the ground terminal GND represents a reference voltage of the output terminal OUT, the common terminal COM and the ground terminal GND may output the same voltage.

A p-type well 131 may be formed around the p-type gate region 134a. The p-type well 131 may partially overlap the p-type field forming layer 130, and may have a greater thickness than that of the p-type field forming layer 130 in a direction toward the p-type semiconductor substrate 110. As the p-type well 131 has a greater thickness than that of the p-type field forming layer 130, when the high voltage HV is applied to the n-type drain region 135a, a depletion layer may be initially formed near the p-type well 131 so as to protect the charge enable unit 101.

An n-type buried layer 132 may be formed between the p-type semiconductor substrate 110 and the n-type semiconductor layer 111 and below the n-type drain region 135a. When the high voltage HV is applied to the n-type drain region 135a, the n-type buried layer 132 induces an electric field to be focused on the n-type buried layer 132 and thus may prevent the n-type drain region 135a from being damaged. The n-type buried layer 132 may have a higher concentration than that of the p-type field forming layer 130.

The drain contact 135b may be connected to the voltage terminal $V_B$ illustrated in FIG. 1. As illustrated in FIG. 1, the voltage terminal $V_B$ is connected to the bootstrap capacitor C illustrated in FIG. 1, and thus the drain contact 135b is electrically connected to the bootstrap capacitor C. Also, the drain contact 135b may be electrically connected to the high voltage region 22 through a conductive layer 145 formed on the insulating layer 140.

If a ground voltage is output from the output terminal OUT illustrated in FIG. 1, a charge voltage $V_C$ of the bootstrap capacitor C is applied to the n-type drain region 135a. The charge voltage $V_C$ is charged by the driving voltage $V_{CC}$ and thus may not be higher than the driving voltage $V_{CC}$. In this case, an electric potential of the p-type gate region 134a having a high concentration, which is formed in the p-type field forming layer 130, is not greatly different from an electric potential of the n-type drain region 135a having a high concentration, and thus a current flows from the n-type source region 133a to the n-type drain region 135a.

On the other hand, if an output voltage is the high voltage HV, a voltage obtained by adding the high voltage HV to the charge voltage $V_C$ of the bootstrap capacitor C (HV+$V_C$) is applied to the n-type drain region 135a. In this case, the electric potential of the n-type drain region 135a is much higher than the electric potential of the p-type gate region 134a and thus a thick depletion layer may be formed between the n-type semiconductor layer 111 and the p-type field forming layer 130. Due to the thick depletion layer, a very large resistance is formed between the n-type source region 133a and the n-type drain region 135a. The p-type field forming layer 130, which is widely formed between the n-type source region 133a and the n-type drain region 135a, creates uniform equipotential lines vertically in the n-type semiconductor layer 111 under the p-type field forming layer 130. As such, if the output voltage is the high voltage HV, as the large resistance is formed between the n-type source region 133a and the n-type drain region 135a, most of the high voltage HV is dropped before reaching the n-type source region 133a. Thus, the PNP transistor 103 of the charge enable unit 101 may be prevented from being applied by the high voltage HV and thus being broken.

A gate electrode 143 connected to the gate contact 134b is formed in a multilayer structure as illustrated in FIG. 3 and a layer that is greatly spaced apart from the p-type field forming layer 130 may be formed to be wide. In addition, a drain electrode 144 connected to the drain contact 135b is also formed in a multilayer structure and a layer that is an upper layer may be formed to be wide. As such, if the high voltage HV is applied to the drain electrode 144, the above structure may allow the depletion layer between the p-type field forming layer 130 and the n-type semiconductor layer 111 to be formed uniformly, and thus uniform equipotential lines may be formed.

FIG. 4 is a magnified view of the bootstrap driving circuit 100 illustrated in FIG. 2 and is a schematic plan view of the bootstrap driving circuit 100 illustrated in FIG. 3. For convenience of explanation, in FIG. 4, the insulating layer 140 and the conductive layers 142 and 143 illustrated in FIG. 3 are omitted and the n-type under layer 120 and the buried layer 132 illustrated in FIG. 3 are not exposed but are illustrated. Also, various contacts formed on regions (125b, 126b, 127b, 133b, 134b, and 135b) are indicated by shaded portions.

Referring to FIGS. 3 and 4, the charge enable unit 101 and the high voltage cut-off unit 102 are disposed between the low voltage region 21 and the high voltage region 22 and are isolated form the low voltage region 21 and the high voltage region 22 by the first and second isolation regions 24 and 26.

As illustrate in FIG. 4, the n-type semiconductor layer 111 is formed between the first and second isolation regions 24 and 26. The PNP transistor 103 is formed in the charge enable unit 101 on the n-type semiconductor layer 111. The PNP transistor 103 may include the p-type body 124 disposed at the center, the n-type well 123 surrounding the p-type body 124, and the p-type well 122 surrounding the n-type well 123. As illustrate in FIG. 3, the p-type under layer 121 may be formed under the p-type well 122 and the n-type well 123.

The n-channel JFET 104 is formed in the high voltage cut-off unit 102 on the n-type semiconductor layer 111. The n-channel JFET 104 may include the n-type source region 133a, the p-type field forming layer 130 including the p-type gate region 134a, and the n-type drain region 135a. Also, the n-channel JFET 104 may further include the p-type well 131 formed in the p-type field forming layer 130, and may further include the n-type buried layer 132 having a high concentration.

As illustrate in FIG. 4, the emitter contact 125b, the base contact 126b, and the collector contact 127b may be, respectively, formed on the p-type body 124, the n-type well 123, and the p-type well 122. The base contact 126b and the collector contact 127b may be formed at an outer side of the emitter contact 125b in rectangular shapes. Also, the source contact 133b, the gate contact 134b, and the drain contact 135b may be, respectively, formed on the n-type source region 133a, the p-type well 131, and the n-type drain region 135a.

As such, the emitter contact 125b is connected to the driving power source terminal $V_{CC}$ illustrated in FIG. 1, the base contact 126b, the collector contact 127b, and the source contact 133b are connected to each other, the gate contact 134b is connected to the common terminal COM illustrated in FIG. 1, and the drain contact 135b is connected to the bootstrap capacitor C illustrated in FIG. 1 and the high voltage region 22 through the voltage terminal $V_B$ illustrated in FIG. 1.

Figure 6:
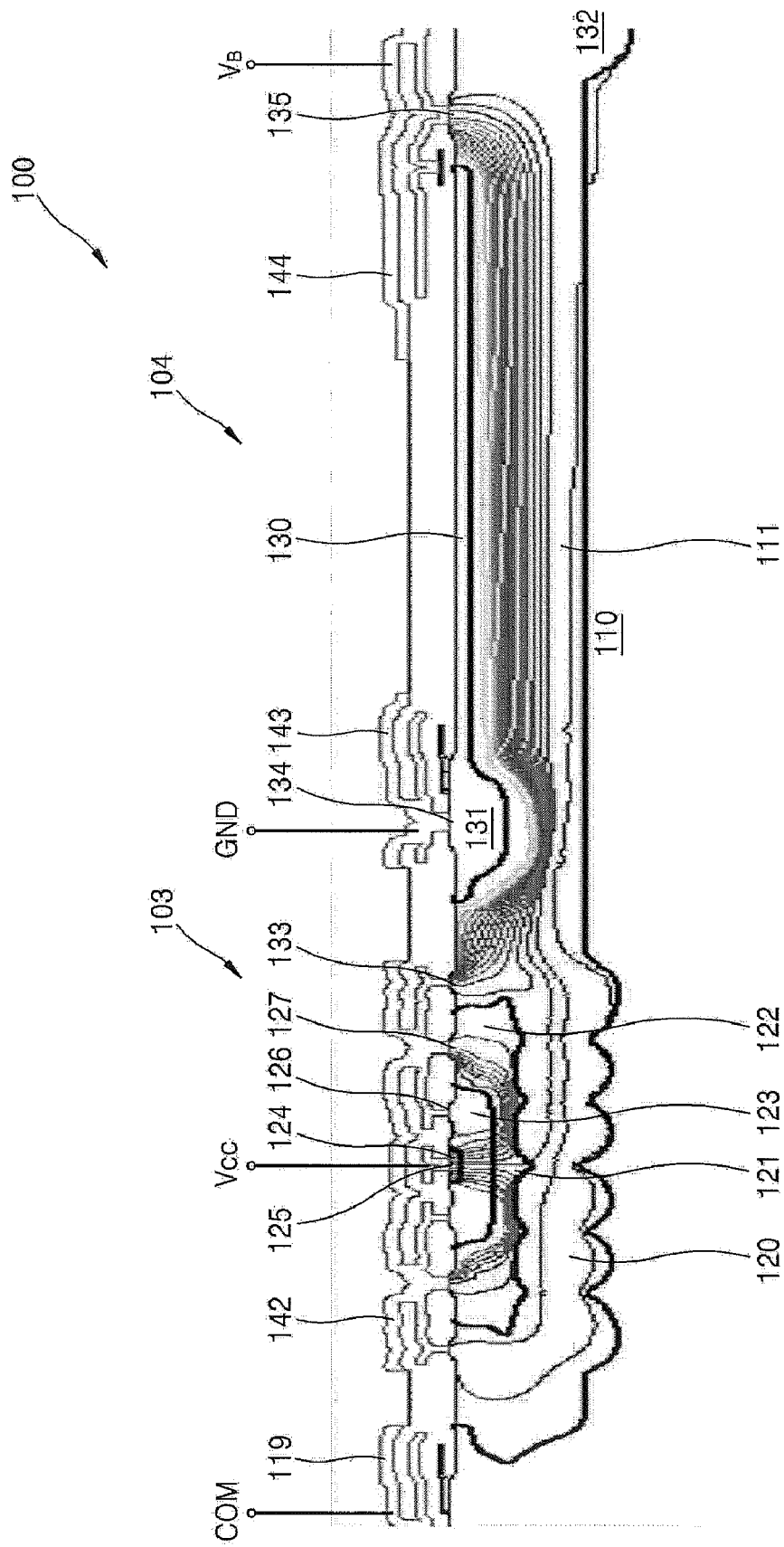
FIGS. 6, 7, and 8 are diagrams showing simulation results in a power semiconductor device that adopts the bootstrap driving circuit illustrated in FIG. 3.

FIG. 6 is a diagram showing a simulation result for checking a leakage current in a power semiconductor device that adopts the bootstrap driving circuit 100 illustrated in FIG. 3.

Referring to FIGS. 3 and 6, for example, about 15V is applied to an emitter 125 of the PNP transistor 103 in the charge enable unit 101 through the driving power source terminal $V_{CC}$ illustrated in FIG. 1 and about 0V is applied to a drain 135 of the n-channel JFET 104 in the high voltage cut-off unit 102 through the voltage terminal $V_B$ illustrated in FIG. 1. Also, the p-type semiconductor substrate 110 is grounded through the conductive layer 119 formed on the first isolation layer 114, and a gate 134 of the n-channel JFET 104 in the high voltage cut-off unit 102 is also grounded. In the above environment, in general, the largest current flows into the bootstrap driving circuit 100 through the emitter 125 of the PNP transistor 103 and thus the largest leakage current may occur. FIG. 6 illustrates a case when a current flows into the bootstrap driving circuit 100 through the emitter 125 of the PNP transistor 103.

As in FIG. 3, in FIG. 6, the emitter 125 of the PNP transistor 103 is formed on the p-type body 124, and a base 126 of the PNP transistor 103 is formed on the n-type well 123 surrounding the p-type body 124. Also, a collector 127 of the PNP transistor 103 is formed on the p-type well 122 and the p-type under layer 121, which surround the n-type well 123. In FIG. 6, the n-type under layer 120 having a high concentration is formed between the p-type under layer 121 and the p-type semiconductor substrate 110, and n-type regions in circular shapes are continuously formed.

As illustrated in FIG. 6, a current flowing from the emitter 125 of the PNP transistor 103 flows to the base 126 and the collector 127 of the PNP transistor 103, and more particularly, to the collector 127. The current flowing into the collector 127 flows to a source 133 of the n-channel JFET 104 through the conductive layer 142 that connects the collector 127 and the source 133 of the n-channel JFET 104. The current flowing into the source 133 flows to the drain 135 of the n-channel JFET 104 through the n-type semiconductor layer 111. As such, most of the current flowing from the emitter 125 of the PNP transistor 103 flows to the drain 135 of the n-channel JFET 104.

Figure 7:
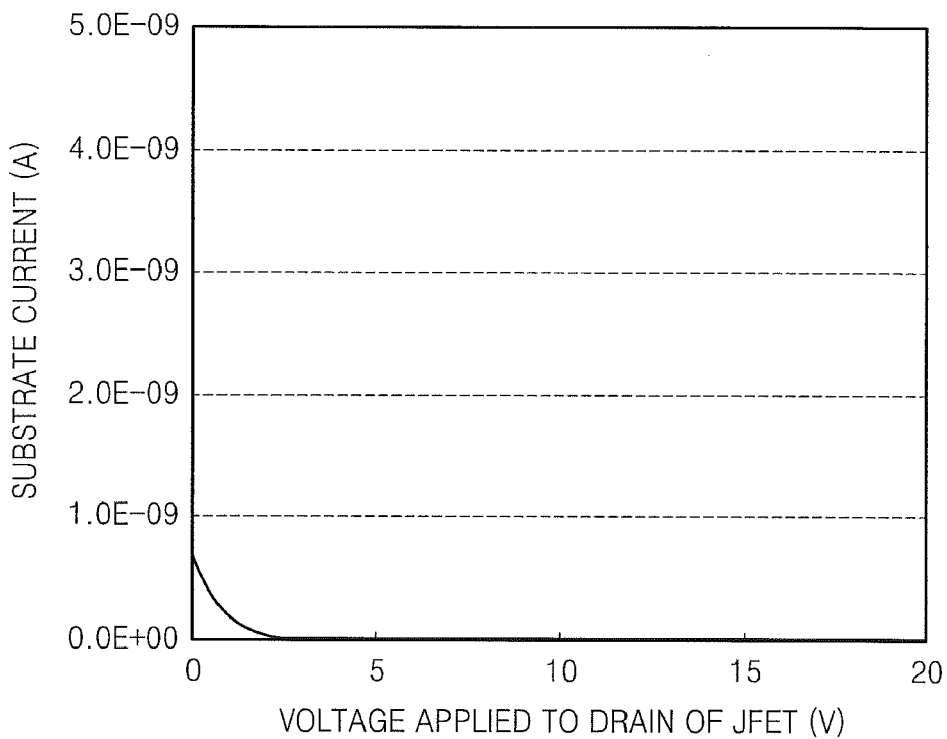

FIG. 7 is a graph showing a simulation result of the amount of a leakage current according to a voltage applied to a drain of an n-channel JFET when 15V is applied to an emitter of a PNP transistor, in a power semiconductor device that adopts the bootstrap driving circuit 100 illustrated in FIG. 3.

As illustrated in FIG. 7, in the power semiconductor device that adopts the bootstrap driving circuit 100 illustrated in FIG. 3, only if the voltage applied to the drain of the n-channel JFET is lower than about 2V does a leakage current equal to or lower than 1 nA occur. Since the drain of the n-channel JFET is connected to a bootstrap capacitor C, a voltage that is slightly lower than 15V applied to the emitter of the PNP transistor, for example, about 14V, is always applied to the drain of the n-channel JFET. Thus, if the power semiconductor device operates normally, the voltage applied to the drain may be higher than about 2V and thus a leakage current may not occur.

Figure 8:
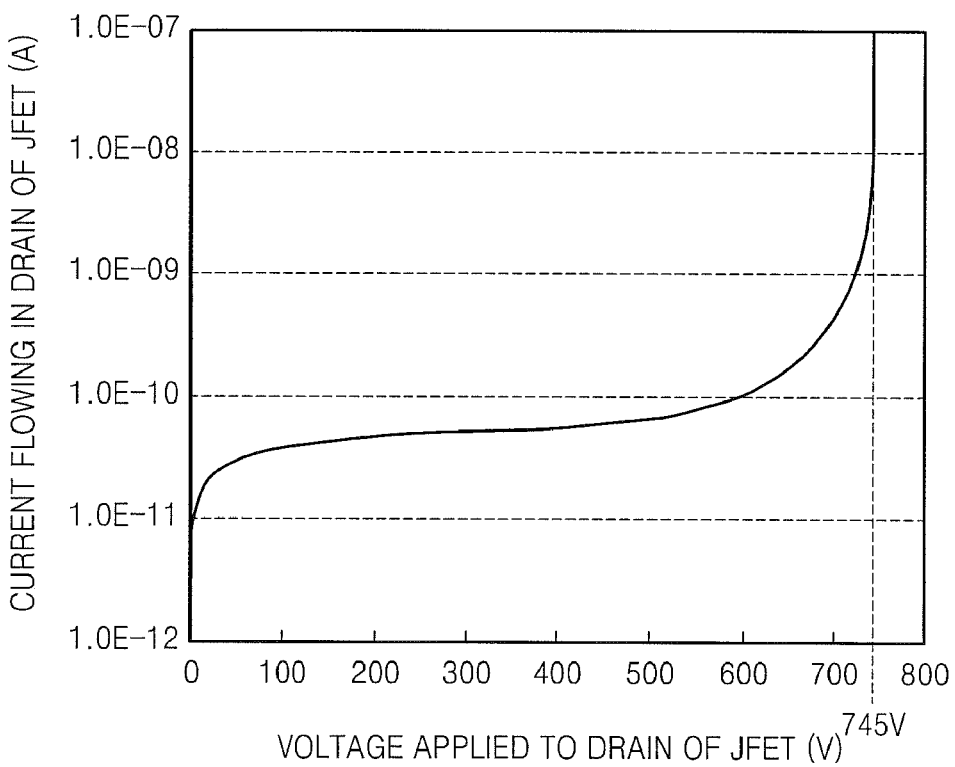

FIG. 8 is a graph showing a simulation result of the amount of a current flowing in a drain of an n-channel JFET according to a voltage applied to the drain of the n-channel JFET, in a power semiconductor device that adopts the bootstrap driving circuit 100 illustrated in FIG. 3.

As illustrated in FIG. 8, the current stably flows in the drain of the n-channel JFET until about 745V is applied to the drain of the n-channel JFET. If a voltage higher than about 745V is applied to the drain of the n-channel JFET, the current flowing in the drain of the n-channel JFET greatly increases. This is because a charge enable unit is broken down as an electric potential between the charge enable unit and a high voltage cut-off unit increases. Thus, the bootstrap driving circuit 100 illustrated in FIG. 3 may stand against a voltage equal to or lower than about 745V.

Figure 9:
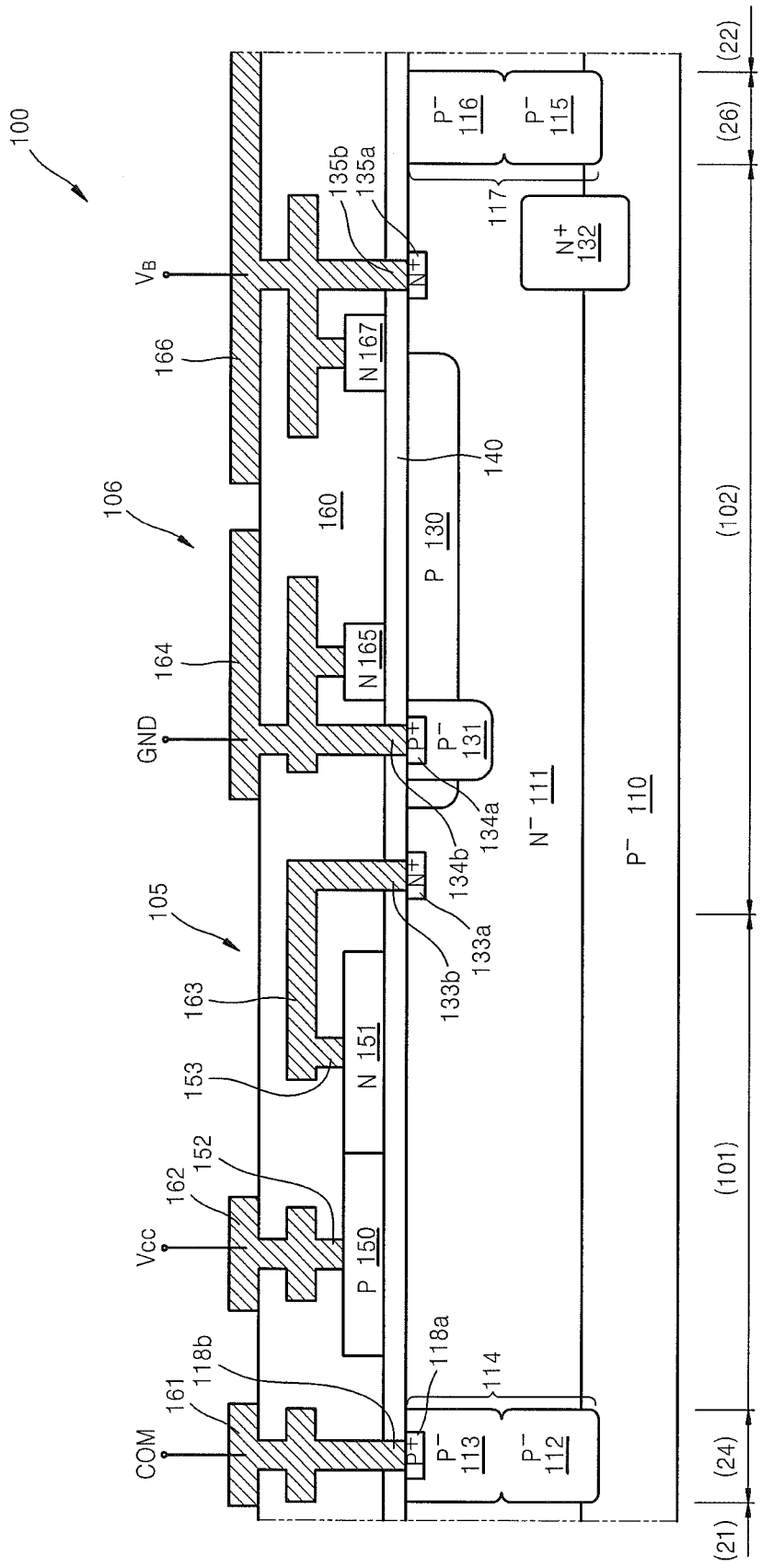
FIG. 9 is a cross-sectional view of a bootstrap driving circuit taken along a line A-A' illustrated in FIG. 2, according to another embodiment of the present invention.

FIG. 9 is a cross-sectional view of a bootstrap driving circuit 100 taken along a line A-A' illustrated in FIG. 2, according to another embodiment of the present invention.

Referring to FIG. 9, an n-type semiconductor layer 111 that may be an n-type epitaxial layer having a low concentration may be formed on a p-type semiconductor substrate 110 having a low concentration.

The n-type semiconductor layer 111 may be divided into a low voltage region 21, a first isolation region 24, a charge enable unit 101, a high voltage cut-off unit 102, a second isolation region 26, and a high voltage region 22.

A first isolation layer 114 for isolating the low voltage region 21 and the charge enable unit 101 from each other may be formed on the first isolation region 24. The first isolation layer 114 may include a p-type under layer 112 and a p-type well 113. A ground region 118a having a high concentration may be formed in the p-type well 113. A ground contact 118b may be formed on the ground region 118a and may be electrically connected to a common terminal COM through a conductive layer 161. As such, the first isolation layer 114 and the p-type semiconductor substrate 110 may be grounded.

A second isolation layer 117 for isolating the high voltage cut-off unit 102 and the high voltage region 22 from each other may be formed on the second isolation region 26. The second isolation layer 117 may include a p-type under layer 115 and a p-type well 116.

As illustrated in FIG. 9, the charge enable unit 101 and the high voltage cut-off unit 102 are directly connected to each other without a separate isolation region for isolating them from each other.

The charge enable unit 101 according to the current embodiment will now be described.

An insulating layer 140 may be formed on the n-type semiconductor layer 111. The insulating layer 140 may contain at least one of oxide, nitride, and oxynitride. A diode 105 may be formed on the insulating layer 140. The diode 105 may include a p-type conductive layer 150 and an n-type conductive layer 151 in a PN junction. The p-type conductive layer 150 and the n-type conductive layer 151 may be, respectively, formed of heavily doped p-type and n-type polysilicon. Although the p-type conductive layer 150 and the n-type conductive layer 151 are arranged in a line, the present invention is not limited thereto. The p-type conductive layer 150 and the n-type conductive layer 151 may be arranged in another structure for forming a PN junction, for example, a structure in which a portion of the n-type conductive layer 151 covers a portion of the p-type conductive layer 150.

An anode contact 152 may be formed on the p-type conductive layer 150. The anode contact 152 may be electrically connected to the driving power source terminal $V_{CC}$ illustrated in FIG. 1 through an anode electrode 162. As illustrated in FIG. 9, the anode electrode 162 may be formed in a multilayer structure. An insulating layer 160 may be formed on the anode contact 152 so as to expose only a portion of the anode electrode 162.

A cathode contact 153 may be formed on the n-type conductive layer 151. The cathode contact 153 may be electrically connected to a source contact 133b formed on an n-type source region 133a to be described later, through a conductive layer 163. As illustrated in FIG. 9, the cathode contact 153 and the conductive layer 163 may be formed in the insulating layer 160.

The diode 105 formed in the charge enable unit 101 allows a current to flow only from the anode contact 152 to the cathode contact 153, i.e., from the p-type conductive layer 150 to the n-type conductive layer 151. According to the current embodiment, the driving voltage $V_{CC}$ is applied to the anode contact 152. If an electric potential of the cathode contact 153 is lower than the driving voltage $V_{CC}$, the current flows from the anode contact 152 to the cathode contact 153 through the PN junction between the p-type conductive layer 150 and the n-type conductive layer 151.

However, on the other hand, if the electric potential of the cathode contact 153 is higher than the driving voltage $V_{CC}$, i.e., if a reference electric potential of the high voltage region 22 is the high voltage HV, a reverse voltage is applied to the PN junction between the p-type conductive layer 150 and the n-type conductive layer 151, and thus the current does not flow. However, if the electric potential of the cathode contact 153 with respect to the anode contact 152 is higher than a break voltage, a breakdown may occur and thus the current may flow backward. Thus, the high voltage cut-off unit 102 to be described later is required.

The high voltage cut-off unit 102 is directly connected to the charge enable unit 101 without a separate isolation region. The charge enable unit 101 may include an n-channel JFET 106. The n-type semiconductor layer 111 may be formed on the p-type semiconductor substrate 110. A p-type field forming layer 130 may be formed in the n-type semiconductor layer 111. The n-type source region 133a and an n-type drain region 135a may be formed at two sides of the p-type field forming layer 130. The n-type source region 133a and the n-type drain region 135a may have higher concentrations than that of the n-type semiconductor layer 111. The source contact 133b may be formed on the n-type source region 133a and a drain contact 135b may be formed on the n-type drain region 135a. As described above, the source contact 133b is electrically connected to the anode electrode 153 formed on the n-type conductive layer 151 through the conductive layer 163.

Since the n-type source region 133a and the n-type drain region 135a are electrically connected to each other through the n-type semiconductor layer 111, a current may flow from the n-type source region 133a to the n-type drain region 135a. A resistance component may be formed between the n-type source region 133a and the n-type drain region 135a and may vary according to the concentration of the n-type semiconductor layer 111.

For example, a gate region 134a having a high concentration may be formed in the p-type field forming layer 130 close to the n-type source region 133a. A gate contact 134b may be formed on the p-type gate region 134a. A gate electrode 164 may be formed on the gate contact 134b. The gate electrode 164 may be connected to the common terminal COM illustrated in FIG. 1 and thus may be grounded. The gate electrode 164 may be electrically connected to a conductive layer 165 that is locally formed on the insulating layer 140 on the p-type field forming layer 130. According to a manufacturing process, the conductive layer 165 may be a p-type or an n-type. Also, the conductive layer 165 may be formed of the same material as the n-type conductive layer 151.

A drain electrode 166 may be formed on the drain contact 135b. The drain electrode 166 may be connected to the voltage terminal $V_B$ illustrated in FIG. 1 and may also be connected to the high voltage region 22. The drain electrode 166 may be electrically connected to a conductive layer 167 that is locally formed on the insulating layer 140 on the p-type field forming layer 130. According to a manufacturing process, the conductive layer 167 may be a p-type or an n-type, and may be formed of the same material as the n-type conductive layer 151.

A p-type well 131 may be formed around the p-type gate region 134a. The p-type well 131 may partially overlap the p-type field forming layer 130, and may have a greater thickness than that of the p-type field forming layer 130 in a direction toward the p-type semiconductor substrate 110. As the p-type well 131 has a greater thickness than that of the p-type field forming layer 130, when the high voltage HV is applied to the n-type drain region 135a, a depletion layer may be initially formed near the p-type well 131 so as to protect the charge enable unit 101.

An n-type buried layer 132 may be formed between the p-type semiconductor substrate 110 and the n-type semiconductor layer 111 and below the n-type drain region 135a. When the high voltage HV is applied to the n-type drain region 135a, the n-type buried layer 132 induces an electric field to be focused on the n-type buried layer 132 and thus may prevent the n-type drain region 135a from being damaged. The n-type buried layer 132 may have a higher concentration than that of the p-type field forming layer 130.

If an output voltage is a ground voltage, a charge voltage $V_C$ of the bootstrap capacitor C illustrated in FIG. 1 is applied to the n-type drain region 135a. The charge voltage $V_C$ is charged by the driving voltage $V_{CC}$ and thus is lower than the driving voltage $V_{CC}$. In this case, a current flows from the n-type source region 133a to the n-type drain region 135a.

On the other hand, if an output voltage is the high voltage HV, a voltage obtained by adding the high voltage HV to the charge voltage $V_C$ (HV+$V_C$) is applied to the n-type drain region 135a. In this case, an electric potential of the n-type drain region 135a is much higher than an electric potential of the p-type gate region 134a and thus a thick depletion layer may be formed between the n-type semiconductor layer 111 and the p-type field forming layer 130. Due to the thick depletion layer, a very large resistance is formed between the n-type source region 133a and the n-type drain region 135a. The p-type field forming layer 130, which is widely formed between the n-type source region 133a and the n-type drain region 135a, creates uniform equipotential lines vertically in the n-type semiconductor layer 111 under the p-type field forming layer 130. As such, if the output voltage is the high voltage HV, as the large resistance is formed between the n-type source region 133a and the n-type drain region 135a, most of the high voltage HV is dropped before reaching the n-type source region 133a. Thus, the PNP transistor 103 of the charge enable unit 101 may be prevented from being applied by the high voltage HV and thus being broken.

Each of the gate electrode 164 and the drain electrode 166 may be formed in a multilayer structure. As illustrated in FIG. 9, a layer that is greatly spaced apart from the p-type field forming layer 130 may be formed to be wide. Ends of the conductive layer 165 and each layer of the gate electrode 164 may be arranged to form a virtual straight line. If the gate electrode 164 is grounded and the high voltage HV is applied to the drain electrode 166, the multilayer structure of each of the gate electrode 164 and the drain electrode 166 and the conductive layer 165 may allow the depletion layer between the p-type field forming layer 130 and the n-type semiconductor layer 111 to be formed uniformly, and thus uniform equipotential lines may be formed.

Figure 10A:
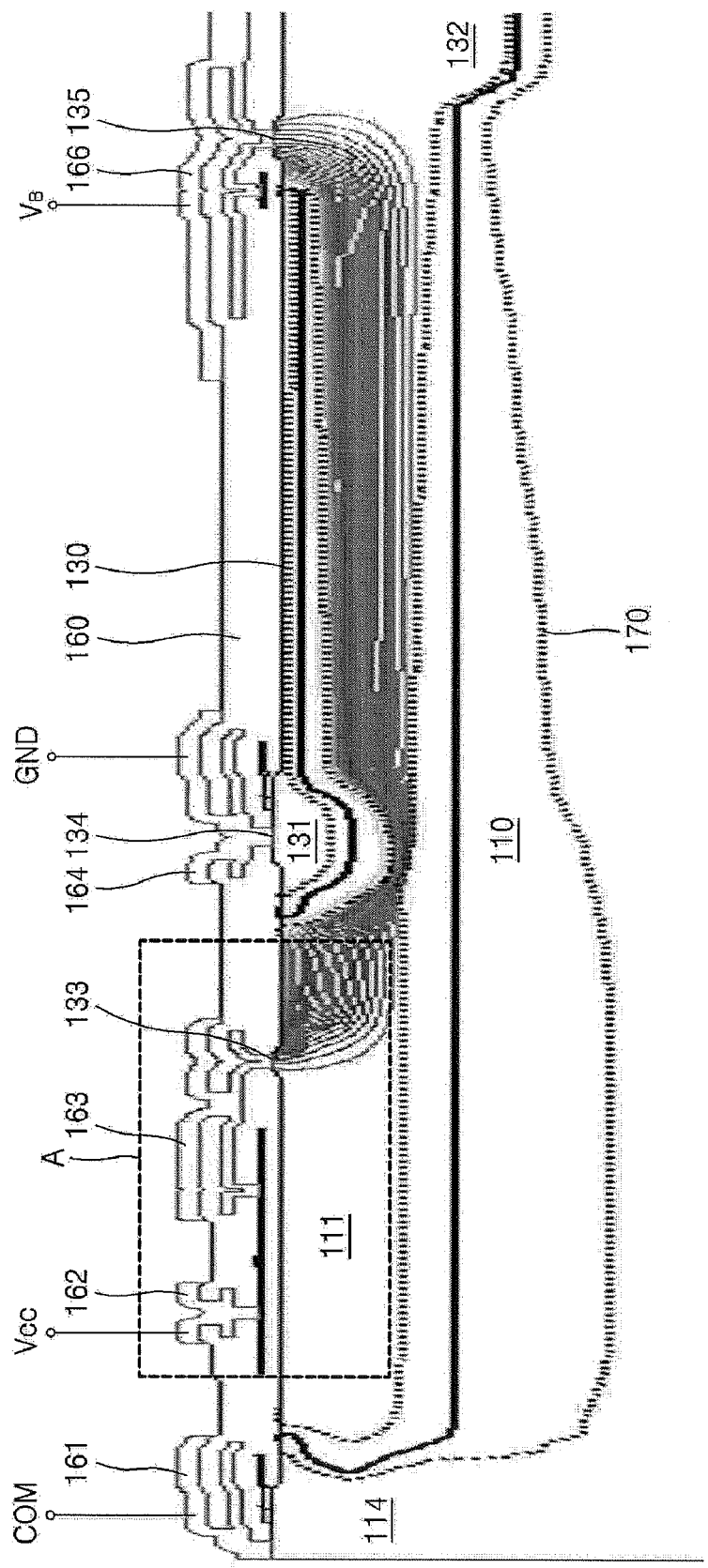
FIGS. 10A, 10B, and 11 are diagrams showing simulation results in a power semiconductor device that adopts the bootstrap driving circuit illustrated in FIG. 9.
Figure 10B:
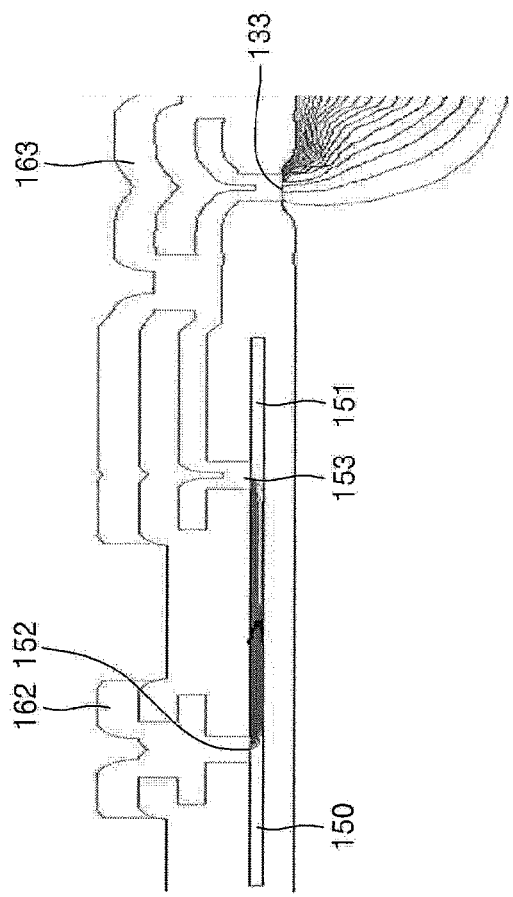

FIGS. 10A and 10B are diagrams showing a simulation result in a power semiconductor device that adopts the bootstrap driving circuit 100 illustrated in FIG. 9. FIG. 10A illustrates the flow of a current when the p-type semiconductor substrate 110 and the gate 134 of the n-channel JFET 106 are grounded, 15V is applied to the anode electrode 162, and 0V is applied to the drain 135 of the n-channel JFET 106. FIG. 10B is a magnified view of a portion A illustrated in FIG. 10A.

Referring to FIGS. 9, 10A, and 10B, a depletion layer is formed between the p-type semiconductor substrate 110 and the n-type semiconductor layer 111. Also, a depletion layer is formed between the n-type semiconductor layer 111 and the p-type field forming layer 130 and the p-type well 131. Boundaries of the depletion layers are represented by dotted lines 170. A depletion layer is an electrically insulating layer and thus a current does not flow through the depletion layer.

A current flowing from the anode electrode 162 connected to the p-type conductive layer 150 flows to the n-type conductive layer 151. Since the n-type conductive layer 151 is connected to the n-type source region 133a of the n-channel JFET 106 through the conductive layer 163, the current flows into the n-channel JFET 106. Then, the current flows to the drain 135 of the n-channel JFET 106 through the n-type semiconductor layer 111. Referring to FIG. 1, a drain 135 is connected to the voltage terminal $V_B$ and the bootstrap capacitor C and thus the current flowing into the drain 135 of the n-channel JFET 106 may charge the bootstrap capacitor C.

Referring to FIG. 10B, the current flowing from the anode electrode 162 completely flows to the n-type conductive layer 151. That is, a leakage current to the p-type semiconductor substrate 110 does not exist.

Figure 11:
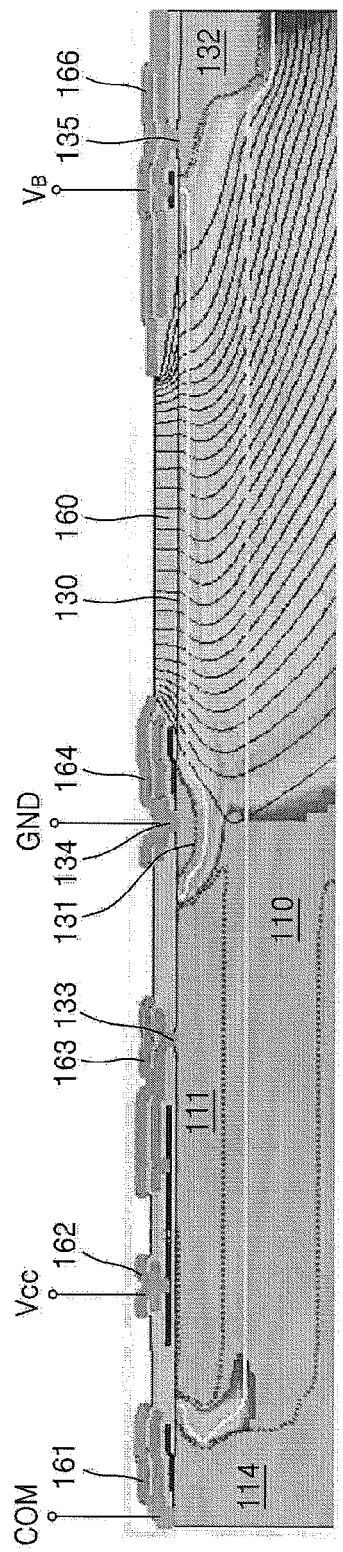

FIG. 11 is a diagram showing a simulation result in a power semiconductor device that adopts the bootstrap driving circuit 100 illustrated in FIG. 9. FIG. 11 illustrates equipotential lines when the p-type semiconductor substrate 110 and the gate 134 of the n-channel JFET 106 are grounded, 15V is applied to the anode electrode 162, and about 615V is applied to the drain 135 of the n-channel JFET 106. Here, 615V is a voltage obtained by adding the high voltage HV (600V) and the charge voltage $V_C$ (15V) of the bootstrap capacitor C.

Referring to FIGS. 9 and 11, a boundary between the p-type semiconductor substrate 110 and the n-type semiconductor layer 111 and a boundary between the n-type semiconductor layer 111 and the p-type field forming layer 130 are represented by white lines. Also, an interval between equipotential lines represents about 20V. As illustrated in FIG. 11, most of the high voltage (615V) is dropped between the gate 134 and the drain 135 of the n-channel JFET 106. Also, a uniformly voltage drop occurs along the p-type field forming layer 130. An electric field caused by an applied voltage is focused on the n-type buried layer 132 rather than the drain 135 of the n-channel JFET 106 so as to allow stable operation.

Also, a voltage near a source 133 of the n-channel JFET 106 is 22V. Thus, in the diode 105 including the p-type conductive layer 150 and the n-type conductive layer 151, a reverse voltage higher than a break voltage does not occur and thus a breakdown may not occur.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A power semiconductor device comprising:
   a high voltage unit that provides a high voltage control signal so that a high voltage is output;
   a low voltage unit that provides a low voltage control signal so that a ground voltage is output, and is spaced apart from the high voltage unit;
   a charge enable unit that is electrically connected to the low voltage unit and charges a bootstrap capacitor for supplying power to the high voltage unit when the high voltage is output, when the ground voltage is output; and
   a high voltage cut-off unit that cuts off the high voltage when the high voltage is output so that the high voltage is not applied to the charge enable unit, and comprises a first terminal electrically connected to the charge enable unit and a second terminal electrically connected to the high voltage unit.

2. The power semiconductor device of claim 1, wherein the charge enable unit comprises a diode.

3. The power semiconductor device of claim 2, wherein the diode comprises an anode and a cathode,
   wherein the anode is electrically connected to a driving power source, and
   wherein the cathode is electrically connected to the first terminal of the high voltage cut-off unit by a conductive layer.

4. The power semiconductor device of claim 2, wherein the charge enable unit comprises:
   an n-type semiconductor layer formed on a p-type semiconductor substrate;
   an insulating layer formed on the n-type semiconductor layer; and
   a p-type conductive layer and an n-type conductive layer formed on the insulating layer in a junction.

5. The power semiconductor device of claim 4, wherein a first isolation region is formed in the n-type semiconductor layer, and
   wherein the charge enable unit and the low voltage unit are isolated from each other by the first isolation region.

6. The power semiconductor device of claim 4, wherein the p-type conductive layer is insulated from the n-type semiconductor layer by the insulating layer.

7. The power semiconductor device of claim 4, wherein a cathode contact is formed on the n-type conductive layer,
   wherein a source region having a high concentration, on which the first terminal of the high voltage cut-off unit is formed, is formed on the n-type semiconductor layer, and
   wherein the cathode contact is electrically connected to the source region.

8. The power semiconductor device of claim 4, wherein the p-type conductive layer and the n-type conductive layer are formed of polysilicon.

9. The power semiconductor device of claim 1, wherein the charge enable unit comprises a PNP transistor.

10. The power semiconductor device of claim 9, wherein the PNP transistor comprises an emitter, a base, and a collector,
    wherein the emitter is electrically connected to a driving power source, and
    wherein the base and the collector are electrically connected to the first terminal of the high voltage cut-off unit.

11. The power semiconductor device of claim 9, wherein the charge enable unit comprises:
    an n-type semiconductor layer formed on a p-type semiconductor substrate;
    a p-type well formed in the n-type semiconductor layer;
    an n-type well formed in the p-type well; and
    a p-type body formed in the n-type well.

12. The power semiconductor device of claim 11, wherein the p-type well comprises a p-type under layer formed under the n-type well and a p-type side well formed at a side of the n-type well, and
    wherein the p-type under layer has a higher concentration than that of the p-type side well.

13. The power semiconductor device of claim 11, wherein the charge enable unit further comprises an n-type under layer formed between the p-type semiconductor substrate and the p-type well.

14. The power semiconductor device of claim 13, wherein the n-type under layer has a higher concentration than that of the p-type well and the n-type well.

15. The power semiconductor device of claim 11, further comprising:
    an emitter region having a high concentration that is formed in the p-type body;
    a base region having a high concentration that is formed in the n-type well;
    a collector region having a high concentration that is formed in the p-type well;
    a base contact formed on the base region; and
    a collector contact formed on the collector region,
    wherein a source region having a high concentration, on which the first terminal of the high voltage cut-off unit is formed, is formed on the n-type semiconductor layer, and
    wherein the base contact and the collector contact are electrically connected to the source region.

16. The power semiconductor device of claim 1, wherein the high voltage cut-off unit comprises an n-channel junction field effect transistor (JFET), and
    wherein the first and second terminals of the high voltage cut-off unit are a source and a drain of the n-channel JFET, respectively.

17. The power semiconductor device of claim 16, wherein the high voltage cut-off unit comprises:
- an n-type semiconductor layer formed on a p-type semiconductor substrate; and
- a p-type field forming layer formed in the n-type semiconductor layer.

18. The power semiconductor device of claim 17, further comprising:
- a source region having a high concentration that is formed in the n-type semiconductor layer;
- a source contact formed on the source region;
- a drain region having a high concentration that is formed in the n-type semiconductor layer;
- a drain contact formed on the drain region;
- a gate region having a high concentration that is formed in the p-type field forming layer; and
- a gate contact formed on the gate region,
- wherein the gate region is closer to the source region than to the drain region.

19. The power semiconductor device of claim 18, wherein the high voltage cut-off unit further comprises a p-type well that partially overlaps the p-type field forming layer under the gate region and has a greater thickness than that of the p-type field forming layer.

20. The power semiconductor device of claim 18, wherein the high voltage cut-off unit further comprises an n-type buried layer formed between the n-type semiconductor layer and the p-type semiconductor substrate and below the drain region, and
- wherein the n-type buried layer has a higher concentration than that of the p-type field forming layer.

21. The power semiconductor device of claim 18, wherein the gate contact of the n-channel JFET is grounded.

22. The power semiconductor device of claim 17, wherein the high voltage cut-off unit and the high voltage unit are isolated from each other by a second isolation region formed in the n-type semiconductor layer.

23. The power semiconductor device of claim 1, wherein the high voltage unit, the low voltage unit, the charge enable unit, and the high voltage cut-off unit are formed on a p-type semiconductor substrate,
- wherein the charge enable unit and the high voltage cut-off unit are formed on an n-type semiconductor layer formed on the p-type semiconductor substrate, and
- wherein the charge enable unit and the high voltage cut-off unit are directly connected to each other without a separate isolation region, on the n-type semiconductor layer.

* * * * *